US 10,199,082 B2

(12) United States Patent
Affleck et al.

(10) Patent No.: US 10,199,082 B2
(45) Date of Patent: Feb. 5, 2019

(54) AUTOMATIC DELAY-LINE CALIBRATION USING A REPLICA ARRAY

(71) Applicant: Avago Technologies International Sales Pte. Limited, Singapore (SG)

(72) Inventors: Steven Affleck, Fort Collins, CO (US); Jerome Beckmann, Loveland, CO (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 3 days.

(21) Appl. No.: 14/997,901

(22) Filed: Jan. 18, 2016

(65) Prior Publication Data

US 2017/0206947 A1    Jul. 20, 2017

(51) Int. Cl.
G11C 7/22 (2006.01)
G11C 7/06 (2006.01)
G11C 7/12 (2006.01)
G11C 17/18 (2006.01)

(52) U.S. Cl.
CPC .............. G11C 7/227 (2013.01); G11C 7/065 (2013.01); G11C 7/12 (2013.01); G11C 7/222 (2013.01); G11C 17/18 (2013.01)

(58) Field of Classification Search
CPC .......... G11C 7/065; G11C 7/12; G11C 7/222; G11C 7/227; G11C 17/18; G11C 2207/2254
See application file for complete search history.

(56) References Cited

U.S. PATENT DOCUMENTS

| 6,052,314 | A  | * | 4/2000 | Sawase ............... G11C 7/1045 365/185.02 |
| 7,477,083 | B2 |   | 1/2009 | Fujisawa et al. |
| 7,626,852 | B2 | * | 12/2009 | Houston ............. G11C 11/413 365/154 |
| 9,640,246 | B2 | * | 5/2017 | Hong .................... G11C 11/417 |
| 2010/0246309 | A1 |   | 9/2010 | Shimono et al. |
| 2013/0135948 | A1 | * | 5/2013 | Hirabayashi .......... G11C 11/419 365/191 |
| 2013/0336080 | A1 |   | 12/2013 | Frans et al. |
| 2015/0003574 | A1 |   | 1/2015 | Mozak |
| 2016/0365140 | A1 | * | 12/2016 | Azuma ................ G11C 13/004 |

FOREIGN PATENT DOCUMENTS

JP    2017004587 A  *  1/2017  ........... G11C 13/004

* cited by examiner

*Primary Examiner* — Harry W Byrne
*Assistant Examiner* — R Lance Reidlinger
(74) *Attorney, Agent, or Firm* — Sheridan Ross P.C.

(57) ABSTRACT

A computer memory system, delay calibration circuit, and method of operating a delay calibration circuit are provided. The disclosed method includes providing a delay-line ring oscillator on silicon of a chip, providing at least one counter on the silicon of the chip, and measuring a chip-specific delay for performing an operation with the chip by synchronizing the at least one counter and operation of the delay-line ring oscillator with a timing trigger.

20 Claims, 13 Drawing Sheets

AUTOMATIC DELAY-LINE CALIBRATION USING A REPLICA ARRAY

FIELD OF THE DISCLOSURE

The present disclosure is generally directed toward data carriers and, in particular, toward controlling personalization of data carriers, such as tags.

BACKGROUND

The timing of different stages is important in Random Access Memory (RAM)-array design. The timing is divided into two or more different stages. One of those two or more stages is the timing between when a wordline is fired and the sense-amps are enabled where the tracking between bitcells and delay-lines is important. The post-silicon tuning advantages can be applied to other stages as well. During a read operation, a bitcell discharges one bitline of a bitline pair. After a set amount of delay, a sense amp detects the stored data value based on the voltage difference across the bitline pair. The timing of this delay is important to RAM array operation. If the delay is too long, power is wasted and performance is sacrificed. If the delay is too short, not enough differential is created, and the sense amp will not be able to reliably detect the signal (e.g., read the data from the RAM array). The ideal amount of time is a function of process, voltage, and temperature and may vary from chip to chip.

DETAILED DESCRIPTION

Figure 1A:
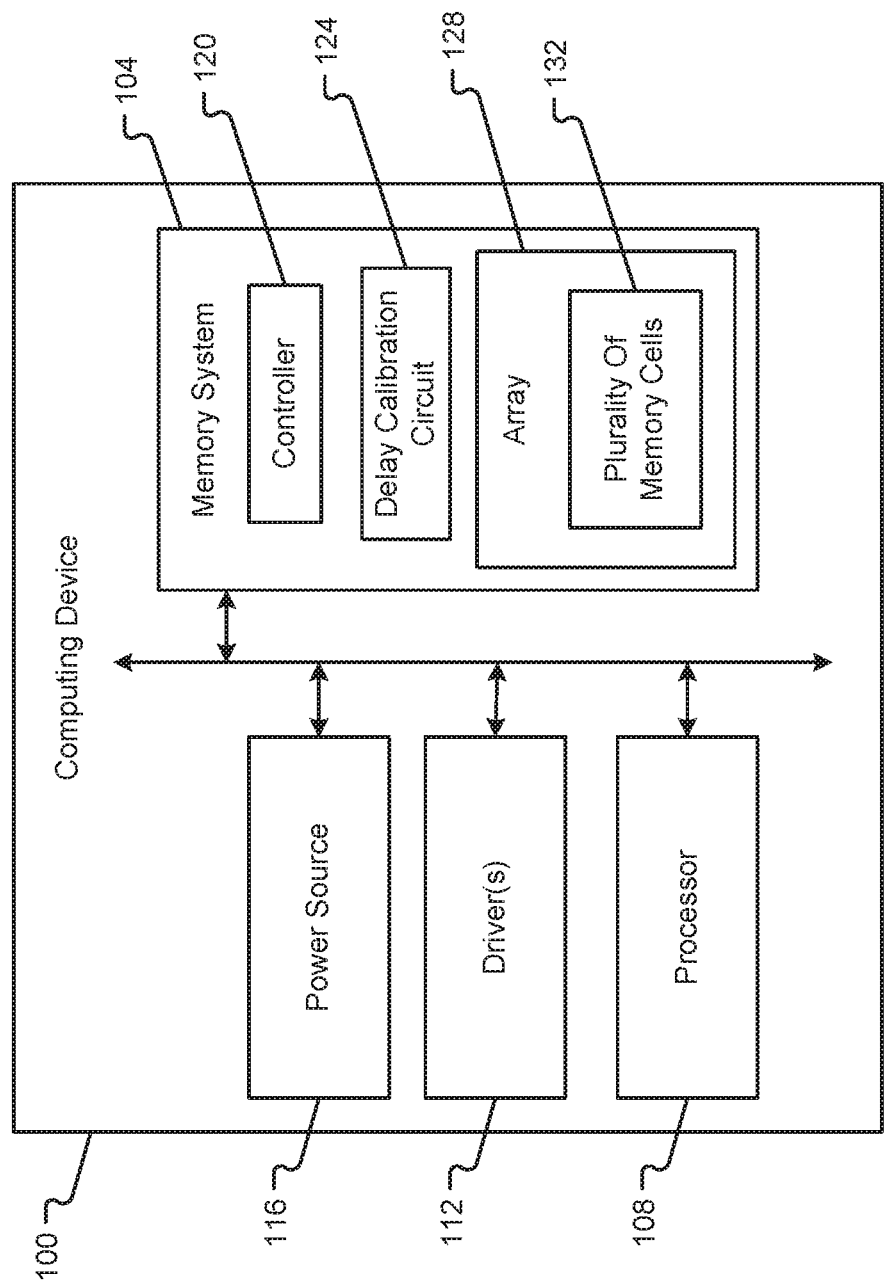
FIG. 1A depicts a first configuration of a computing device with an integrated memory system in accordance with embodiments of the present disclosure.

The ensuing description provides embodiments only, and is not intended to limit the scope, applicability, or configuration of the claims. Rather, the ensuing description will provide those skilled in the art with an enabling description for implementing the embodiments. It being understood that various changes may be made in the function and arrangement of elements without departing from the spirit and scope of the appended claims.

Embodiments of the present disclosure will be described in connection with measuring delay between a time when a bitcell discharges one bitline of a bitline and when a sense amplifier detects a value from the bitlines based on the voltage difference across the bitline pair. This delay can vary from chip to chip and an effective tuning of such delay can help to improve overall performance of memory. Embodiments of the present disclosure can be applied to self-test blocks of memory and dynamically adjust the delay between when a bitline is discharged and when a sense amplifier is used to detect a value from the discharged bitline (either in a read or write operation). In other words, the techniques described herein for measuring/determining delays of a chip can be performed during run-time and each chip can be programmed in-situ (e.g., fuses of the chip could be adjusted on the fly and/or during run-time). The proposed techniques contemplate the use of an additional circuit on silicon with a number of bitcells that is capable of obtaining an accurate measurement (relative or absolute) of timing delay that is optimal for that particular circuit. Rather than providing dummy paths in each memory that is representative of the worst possible (or anticipated) bitcell performance (e.g., the slowest bitcell dictating the overall memory performance), embodiments of the present disclosure can dynamically tune the delay-lines for each circuit, thereby enabling the chip to run at its optimal performance.

While embodiments are described in connection with measuring this particular type of delay for a RAM array on a single silicon chip, it should be appreciated that embodiments of the present disclosure are not so limited. Indeed, the proposed techniques can be applied to measuring any type of delay between processes on silicon and does not need to be limited to memory or, in particular, to RAM memory. The proposed techniques can be applied to write operations in RAM memory, read and/or write operations for other types of memory (e.g., FLASH, ROM, SRAM, DRAM, EEPROM, etc.), and operations not performed in memory devices.

As can be appreciated, there may be many aspects to the present disclosure. Some of those aspects may include, without limitation: (1) using a programmable delay line to set signal timing in a circuit (a memory for example); (2) adjusting the programmable delay line to compensate for process, voltage, and temperature variations; (3) determining the intrinsic speed of the delay line by measuring its performance relative to a standard, like a clock period, this can be done in a circuit external to the memory; (4) measuring the intrinsic speed of the delay element relative to another critical circuit in the memory (e.g., the delay line speed could be compared to the bitcell speed); (5) using the results of any of the above measurements to adjust the setting of each programmable delay line in each individual memory (it should be appreciated that each individual memory could use the measured speed data differently depending on the specific requirements of the memory type; (6) acquiring the measured speed data during IC test and burning that measured speed into fuses for use during field application of the IC; (7) generating the measured speed data in real-time in the field (e.g., during system power up or during system calibration), thereby assisting in compensating for environmental conditions like voltage, temperature, aging, etc.

In accordance with at least some embodiments of the present disclosure, a method and system are provided to adjust the delay settings based upon differences in PVT (process, voltage, temperature) on a per-die basis. Embodiments of the present disclosure enable calibration of RAM array timing settings. It then becomes possible to determine the speed of RAM-cells with respect to delay-cells. The relative speed, in some embodiments, can be used to adjust the number of delay cells employed for critical timing across a chip. This provides a flexible and accurate way of adjusting the timing settings to balance power, reliability and performance on post-production silicon.

One way to achieve this is to implement a relative measurement of delay between a bitcell array and a replica array. Another way to achieve this is to implement an absolute measurement of delay between a bitcell array and an absolute clock measurement.

In the relative measurement scenario, a circuit is proposed with a delay-line ring oscillator, a replica path, and a counter, all on a single piece of silicon (e.g., on a common chip). In some embodiments, the circuits are reset and the delay-line oscillator is started oscillating at the same time as the replica path is triggered. The counter will be incremented by the delay-line oscillator while a signal propagates through the replica path. Once the signal finishes propagating through the replica path, the counter is stopped. The value of the counter will indicate the speed of the delay cells with respect to the replica path.

The replica path, in some embodiments, includes N bitcells, where N in an integer value greater than or equal to two, pulling down in parallel on a bitline with a load that is N times larger than is typical of a bitline. Several replica paths can be connected in series. By increasing the number of bitcells pulling down and the number of paths in series, the effects of local variation can be reduced or otherwise mitigated.

In the absolute measurement scenario, a circuit is proposed with a delay-line ring oscillator, two counters, and a clock signal, all on a single piece of silicon (e.g., on a common chip). One counter is connected to the delay-line ring oscillator; the other counter is connected to a clock signal. The circuits are reset and delay-line oscillator is started at the same time as the clock is started. Both counters will update until the clock reaches a preset value, at which time the counter connected to the delay-line oscillator will be stopped. The value of the counter will indicate the speed of the delay cells with respect to an absolute clock. Using multiple clock cycles reduces the effect of clock jitter on the measurement of delay.

In some embodiments, either type of circuit may be provided with a lookup table. The lookup table can be used to convert the delay measurements (e.g., relative or absolute) into a timing control bus, which can then be stored in one or more fuses. The lookup table can be changed as performance data is gathered or bugs are detected. Changes in the lookup table can then be propagated to adjustments in the fuses, thereby resulting in a change of the timing behavior for the chip.

In some embodiments, all memory arrays on a chip or die can have timing control bus inputs which will be sued to adjust the number of delay used internally for timing purposes. The internal delays can be created using the same delay cells used in the delay-lines.

By using the proposed techniques, there is likely to be less variation in delay than solutions which use embedded replica paths, resulting in less required guard-band (e.g., built-in delay based on the worst-performing bitcell array). Moreover, embodiments of the present disclosure provide better PVT tracking than solutions which utilize delay-lines only, thereby resulting in less required guard-band.

Further still, more efficient area utilization on the chip is possible. In particular, it is costly from an area perspective to reduce variation using embedded replica paths because reducing variation requires more bitcells and more accurate load modeling. These require additional area which gets multiplied by the number of memory arrays on a chip. With the proposed solution, the area penalty is paid just once per chip (e.g., for the replica array), enabling a more accurate measurement of delay while simultaneously increasing the efficiency of area utilization.

Even further still, a more realistic load can be used with the proposed techniques, thereby resulting in better tracking. Finally, the timing control can be decoupled from the PVT measurement, thereby enabling post-silicon timing optimization and bug fixes related to timing. These particular features have not been enabled by previous solutions.

With reference now to FIGS. 1A-8 various details of operating a memory system and measuring delays associated therewith will be described in accordance with at least some embodiments of the present disclosure. The claims should not be construed as being limited to the disclosed techniques, which are merely provided for illustrative purposes.

Figure 1B:
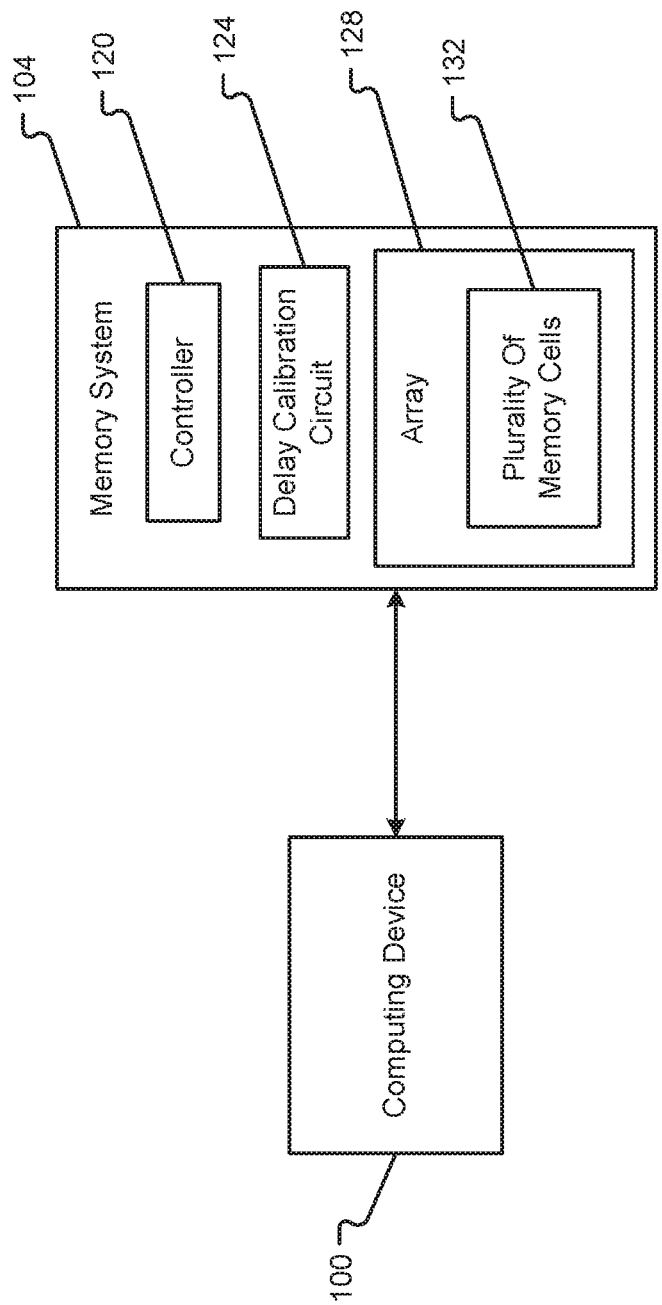
FIG. 1B depicts a second configuration of a computing device connected to a remote memory system in accordance with embodiments of the present disclosure.
Figure 1C:
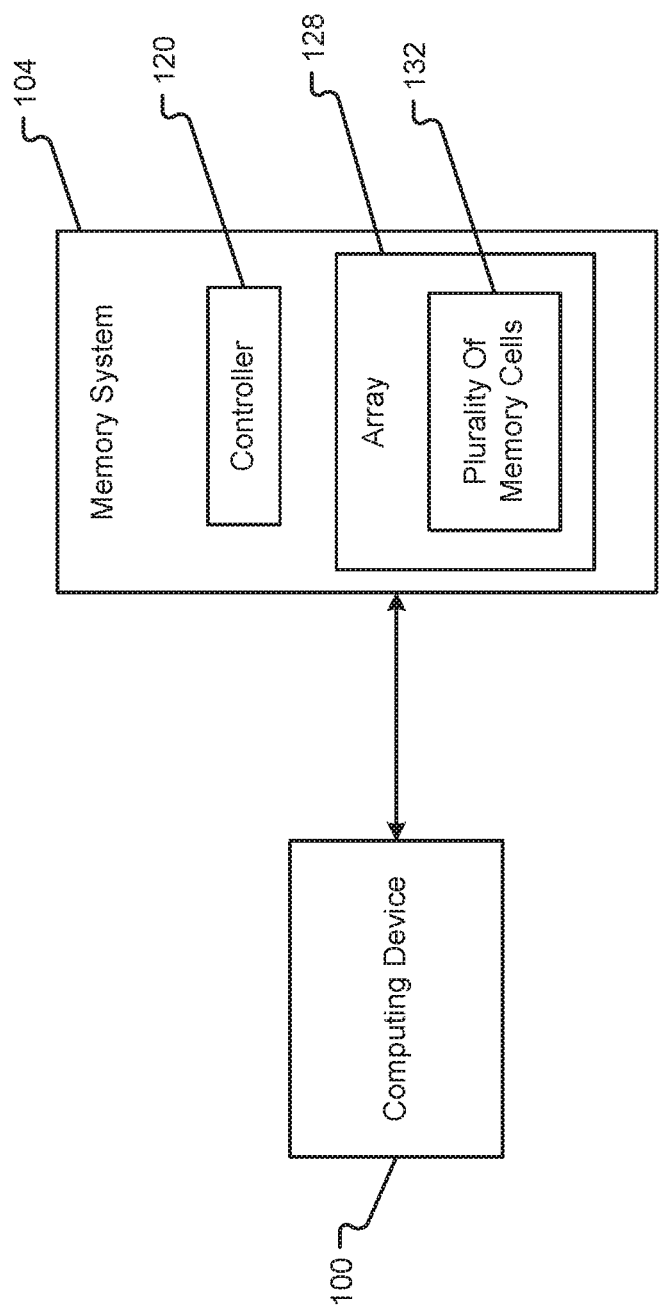
FIG. 1C depicts a third configuration of a computing device connected to a remote memory system in accordance with embodiments of the present disclosure.

With reference initially to FIGS. 1A, 1B, and 1C, a computing device 100 and its interaction with a memory system 104 will be described in accordance with at least some embodiments of the present disclosure. The computing device 100 may have an integrated memory system 104 as shown in FIG. 1A or may connect to a remote memory system 104 as shown in FIG. 1B. Alternatively, a standalone controller 120 may be used to control a plurality of memory cells 132 for debug and/or repair. This particular type of standalone controller 120 may be implemented without the need for a delay calibration circuit as shown in FIG. 1C. In either configuration, the computing device 100 may correspond to any type of known electronic computing device that includes a processor 108, one or more drivers 112, and a power source 116. In the embodiment of FIG. 1A, the memory system 104 may be connected to the processor 108, driver(s) 112, and power source 116 via one or more communication buses or the like. In the embodiment of FIG. 1B, the memory system 104 may be connected to the computing device 100 via a serial or parallel communication interface (e.g., USB, Firewire, SCSI, RS232, etc.). Although not depicted, the computing device 100 of either configuration may further include one or more network interfaces that enable the computing device 100 to communicate with other communication devices and/or remote data storage devices via a communication network.

In some embodiments, the computing device 100 may correspond to a personal computer, laptop, cellular phone, smart phone, tablet, netbook, Personal Digital Assistant (PDA), wearable device (e.g., watch, wristband, glasses, etc.), or the like. Other examples of a computing device 100 include, without limitation, servers, blades, virtual machines, etc.

The processor 108 may correspond to one or many microprocessors that are contained within a common housing or blade with the memory system 104. The processor 108 may be a multipurpose, programmable device that accepts digital data as input, processes the digital data according to instructions stored in its internal memory, and provides results as output. The processor 108 may implement sequential digital logic as it may have internal memory. As with most known microprocessors, the processor 108 may operate on numbers and symbols represented in the binary numeral system.

The driver(s) 112 may correspond to hardware, software, and/or controllers that provide specific instructions to hardware components of the computing device 100, thereby facilitating their operation. For instance, a network interface and/or memory system 104 may each have a dedicated driver 112 that provides appropriate control signals to effect their operation. The driver(s) 112 may also comprise the software or logic circuits that ensure the various hardware components are controlled appropriately and in accordance with desired protocols. For instance, the driver 112 of a network interface may be adapted to ensure that the network interface follows the appropriate network communication protocols (e.g., TCP/IP (at one or more layers in the OSI model), UDP, RTP, GSM, LTE, Wi-Fi, etc.) such that the network interface can exchange communications via a communication network. As can be appreciated, the driver(s) 112 may also be configured to control wired hardware components (e.g., a USB driver, an Ethernet driver, fiber optic communications, etc.).

The power source 116 may include a built-in power supply (e.g., battery) and/or a power converter that facilitates the conversion of externally-supplied AC power into DC power that is used to power the various components of the computing device 100. In some embodiments, the power source 116 may also include some implementation of surge protection circuitry to protect the components of the computing device 100 from power surges.

The memory system 104, whether remote from the computing device 100 or integrated into the computing device 100, may include a controller 120, a delay calibration circuit 124, and a memory array 128 having a plurality of memory cells 132. In some embodiments, the memory array 128 may have memory cells 132 of a particular type (e.g., RAM, ROM, Flash, etc.). In other embodiments, the array 128 may have memory cells 132 of different types (e.g., mixed cells for different uses).

The controller 120 may provide the memory system 104 with the ability to respond to commands from the processor 108 and/or remote computing device 100. For instance, the controller 120 may be provided with the ability to respond to read and/or write commands issued by the processor 108. The controller 120 may, in response to such commands, access one or more of the plurality of memory cells 132 on behalf of the requesting entity (e.g., the processor 108).

In some embodiments, the controller 120 may further utilize the delay calibration circuit 124 to measure the chip-specific delay of the memory system 104 for performing a certain operation (e.g., a read or write operation). In particular, the delay calibration circuit 124 can be utilized to measure a delay for the memory system 104 between when a bitline is discharged and when a sense amplifier should be used to read data from the discharged bitline. As this delay may vary from chip to chip and may further vary over time (e.g., as a result of PVT variations), the delay calibration circuit 124 may be utilized during operation of the memory system 104 and the chip-specific delay of the memory system 104 can be continuously measured and appropriate adjustments to the delays of the memory system 104 can be enforced.

Figure 2:
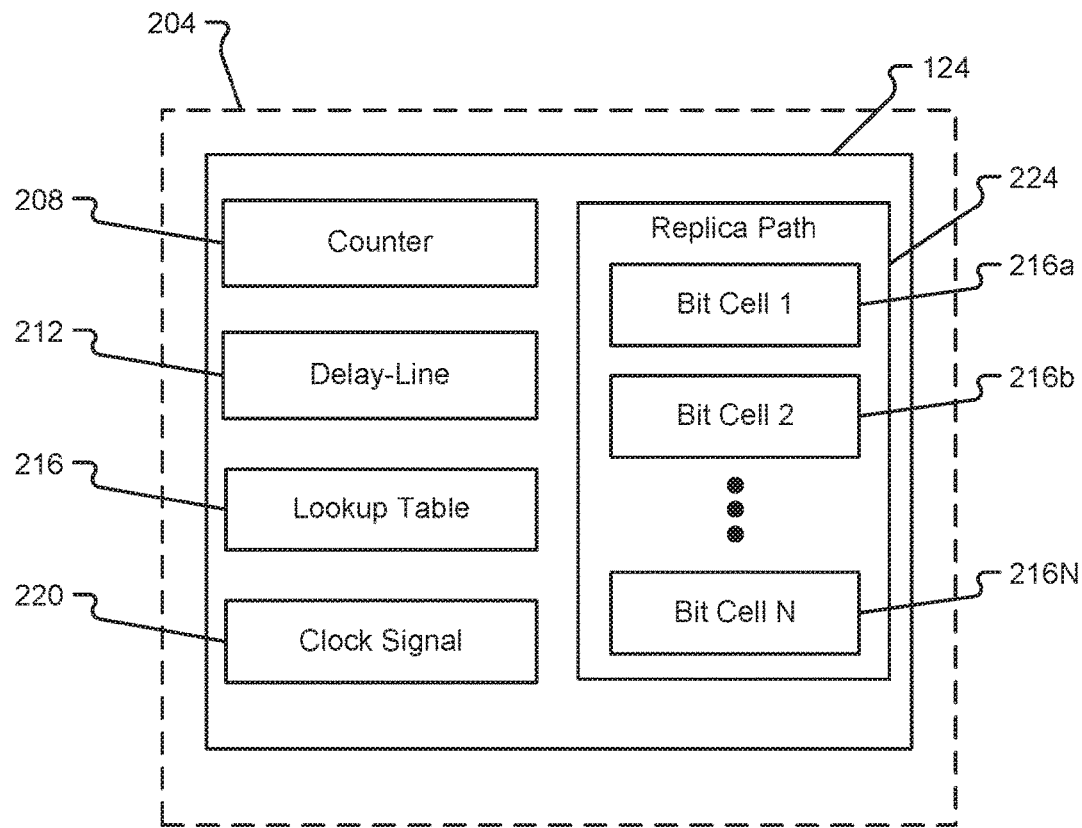
FIG. 2 is a block diagram depicting an illustrative delay calibration circuit on a silicon chip in accordance with embodiments of the present disclosure.

With reference now to FIG. 2, additional details of the delay calibration circuit 124 will be described in accordance with at least some embodiments of the present disclosure. In some embodiments, the delay calibration circuit 124 and its various components can be provided on the same piece of silicon 204 as the rest of the memory array 128. Components of the delay calibration circuit 124 are shown to include one or more counters 208, a delay-line 212, a lookup table 216, a clock signal 220, and a replica path 224 having N bitcells 216a-N, where N is an integer value greater than or equal to one.

The one or more counters 208 may correspond to any type of digital circuitry capable of counting or incrementing a count value in response to a predefined event or impetus. For instance, the counter(s) 208 may be configured to increment a count value in response to detecting a new clock cycle or in response to detecting some other event associated with the delay-line 212 and/or replica path 224. The counter(s) 208 may also be configured to reset their count value in response to a particular event or impetus, depending upon the programming of the counter 208.

The delay-line 212 may correspond to a portion of the circuit 124 that implements an actual or artificial delay between events. In some embodiments, the delay-line 212 may include a delay-line ring oscillator having a plurality of bitcells and a logic gate. The logic gate may receive one or more inputs and provide its output to the plurality of bitcells. The output of the delay-line 212 may be provided as an instruction to increment to one or more of the counter 208.

The lookup table 216 may correspond to a logic table, a state machine, and/or an actual table that is readable by the controller 120. The lookup table 216 may include circuit-specific delay measurements (relative or absolute) and appropriate circuit settings to accommodate such circuit-specific delay measurements. In some embodiments, each memory array in a memory system 104 may have different delay measurements and those delay measurements may be stored in the lookup table 216.

The delay calibration circuit 124 may further include one or more clock signals 220 that are received from the controller 120, the processor 108, or some other clock signal source. The clock signal may oscillate every second or at some other periodic interval. The clock signal 220, in some embodiments, may be completely internal to the silicon 204 of the memory system 104 or it may correspond to a port that receives an external clock signal.

The replica path 224 may have its plurality of bitcells 216a-N pulled down in parallel on a bitline with a load that is N times larger than is typical of a bitline. Although only a single replica path 224 is shown, it should be appreciated that the circuit 124 may comprise a plurality of replica paths 224 connected in series. By increasing the number of bitcells pulling down in parallel on a bitline, the effects of local variation can be reduced.

Figure 3:
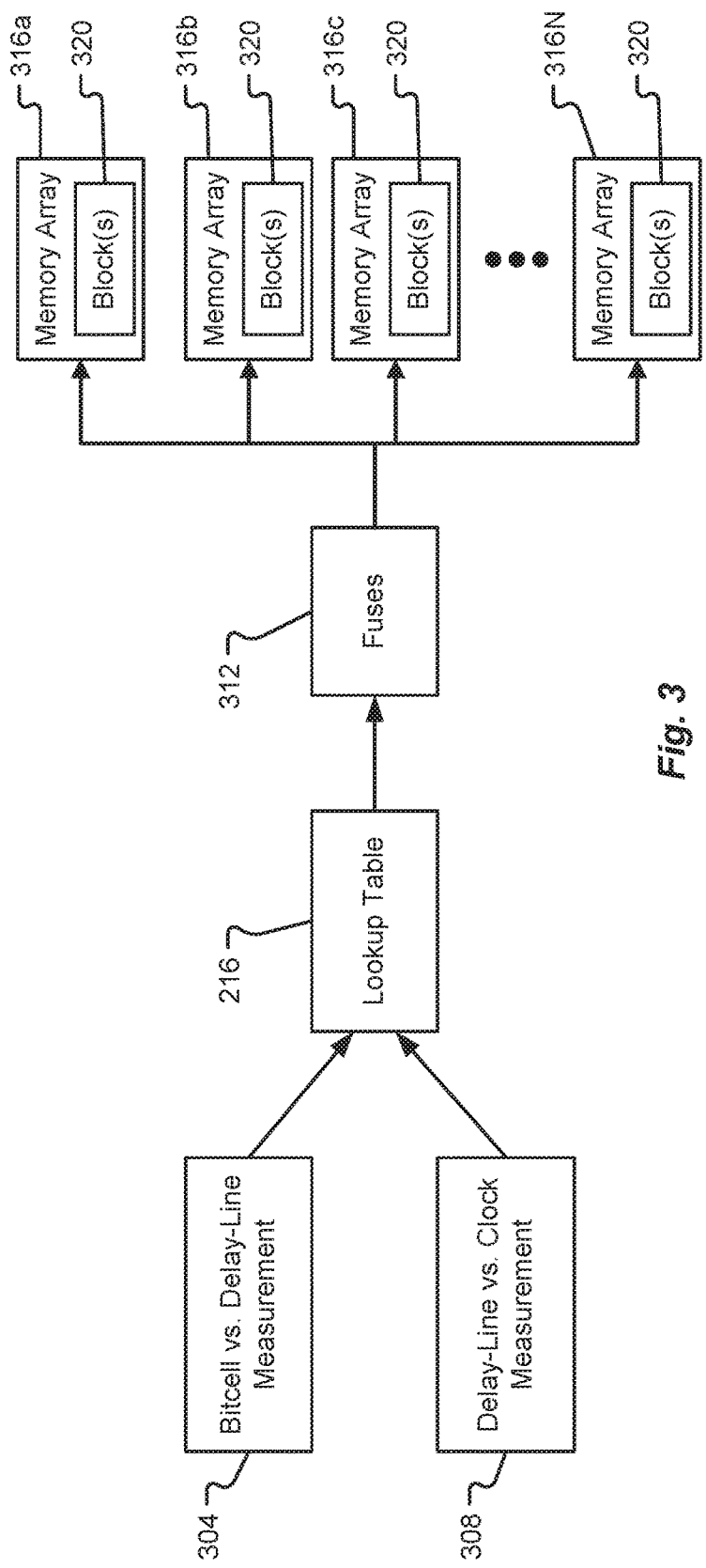
FIG. 3 is a block diagram depicting architectural components of a delay calibration circuit in accordance with embodiments of the present disclosure.

With reference now to FIG. 3, a more specific, but non-limiting, example of the memory system 104 and its ability to have programmable delay lines will be described in accordance with at least some embodiments of the present disclosure. The system 104 is shown to have the lookup table 216 receiving delay measurements as either relative measurements 304 and/or as absolute measurements 308. Although both measurements 304 and 308 are shown as being provided to the lookup table 216 simultaneously, some memory systems 104 may be configured to receive either relative measurements 304 or absolute measurements 308. It may be possible, however, to provide other measurements that are a combinations of absolute and relative measurements. For instance, a bitcell vs. clock measurement may be obtained and provided to the lookup table 216.

Notwithstanding the type of delay measurement received, the lookup table 216 may be programmed with per-line delay values. These values stored in the lookup table 216 can be used to set one or more fuses 312 that ultimately control the timing of the various memory arrays 316a-N. In some embodiments, the fuses 312 may be implemented as one or more of inverters, latches, registers, or the like. The memory arrays 316a-N may be similar or identical to the memory arrays 128 described in any of FIG. 1A, 1B, or 2.

As the memory system 104 operates, the various line-specific delays can be measured by the delay calibration circuit 124 and provided to the lookup table 216. The updated lookup table 216 may then provide data to the fuses 312, which ultimately adjust the timing responsiveness of one or more of the memory arrays 316a-N. More specifically, one or more blocks 320 of memory in the memory arrays 316a-N may comprise a delay circuit to receive the delay data from the fuses 312.

Figure 4A:
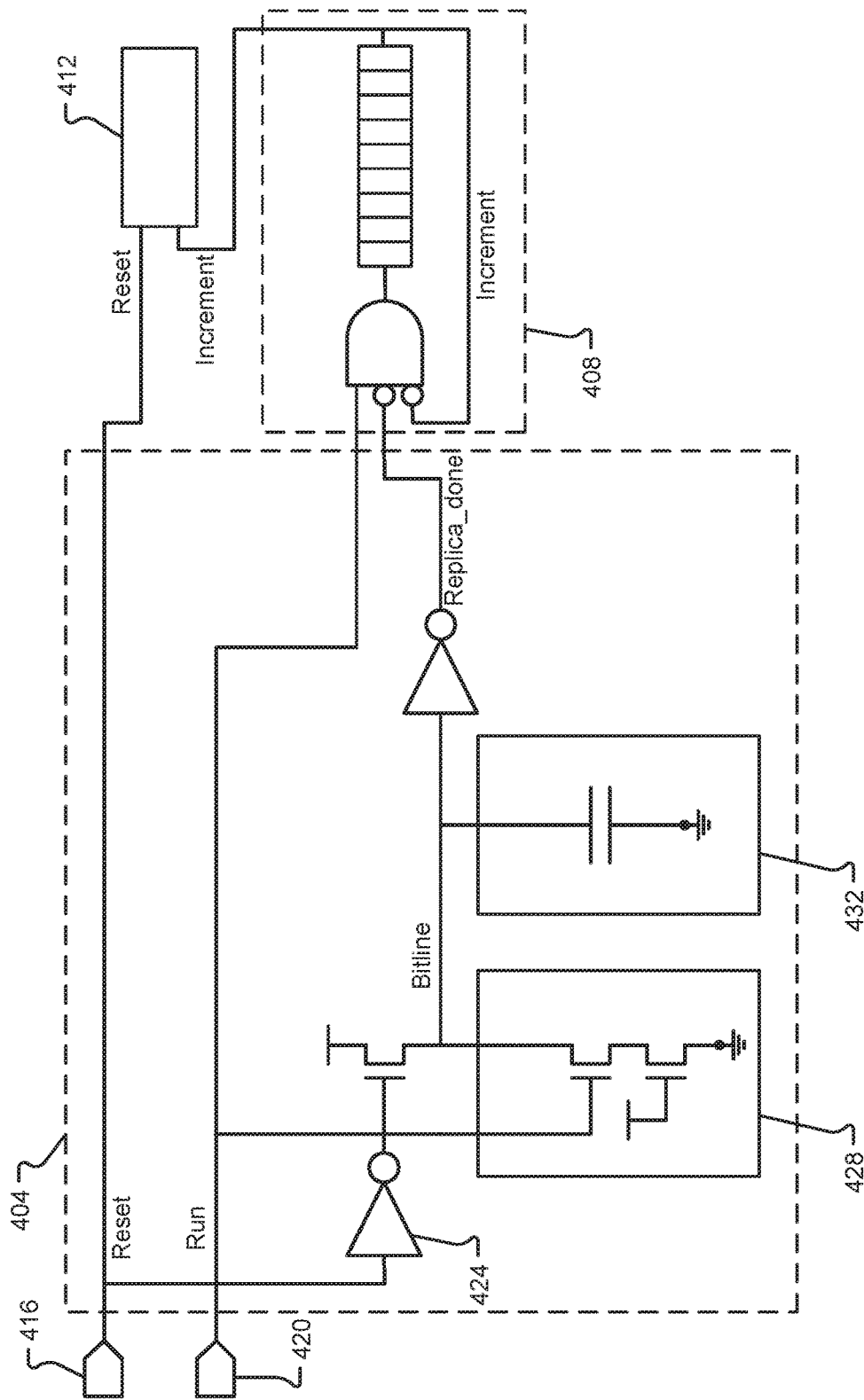
FIG. 4A is a circuit diagram depicting an illustrative circuit for measuring relative delay of using a replica bitcell array in accordance with embodiments of the present disclosure.
Figure 4B:
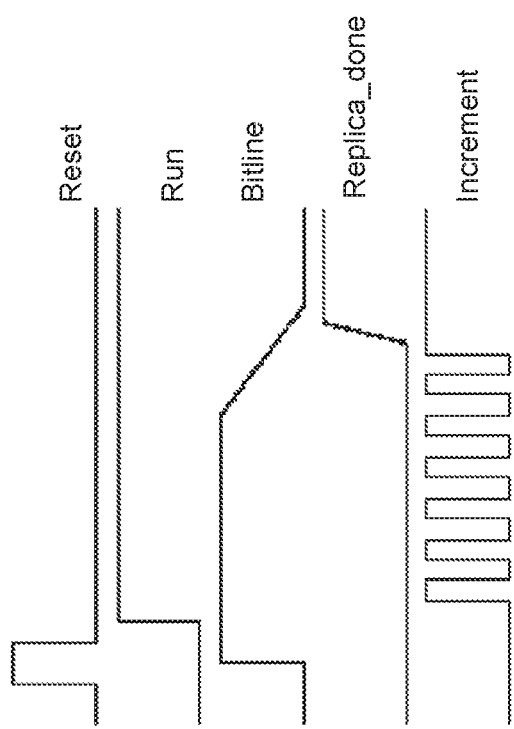
FIG. 4B is a timing diagram depicting the various signals of FIG. 4A.

With reference now to FIGS. 4A and 4B, a specific example of a delay calibration circuit 124 used to measure relative delay will be described in accordance with at least some embodiments of the present disclosure. The circuit of FIG. 4A is shown to include a replica path 404, a delay-line ring oscillator 408, and a counter 412. The replica path 404 receives a Reset input 416 and a Run input 420. The Reset input 420 is split and provided to an inverter 424 of the replica path 404, which provides its output to a bitline controlling transistor. The Reset input 416 is also provided directly to the counter 412. The transistor that receives the output of the inverter 424 may correspond to any type of logic switch such as a MOSFET, N-type MOSFET, P-type MOSFET, or the like.

A tracking bitcell 428 is shown to be controlled by the transistor that receives the output of the inverter 424. The tracking bitcell 428 may comprise a pair of transistors, one of which receives an input from the Run input 420. The transistors in the tracking bitcell 428 may be connected in series between the bitline and ground 428. The transistors in the tracking bitcell 428 may correspond to MOSFETs and they may be the same or different type of transistors. In some embodiments, one of the transistors is a P-type MOSFET whereas the other of the transistors is an N-type MOSFET. There may be a plurality of the tracking bitcells 428 connected in series such that the bitline can be pulled down in parallel.

Also connected to the bitline is a sense amplifier 432. The sense amplifier 432 is shown to include a capacitor, which can be representative or equivalent to a load provided on an actual sense amplifier. The combination of tracking bitcell(s) 428 and sense amplifier 432 enables the replica path 404 to track the average bitcell in the memory array being measured.

The bitline is connected to a second inverter, which provides a Replica_done signal to a logic component (e.g., an AND gate) of the delay-line ring oscillator 408. The logic component is also shown to have a control feedback look and further receives an input from Run input 420. The output of the logic component is provided to a plurality of bitcells in the delay-line ring oscillator 408. The Increment signal output by the delay-line ring oscillator 408 may also be provided as an input to the counter 412.

As shown in FIG. 4B, the circuit of FIG. 4A may operate by first receiving a Reset input, which simultaneously flows to the counter 412 (causing the counter 412 to reset) and to the replica path 404. Thereafter, the bitline is discharged and then the Run input is triggered. This causes the delay-line ring oscillator 408 to oscillate and provide successive Increment inputs to the counter 412, thereby causing the counter 412 to successively increment its count value. The counter 412 continues incrementing in response to the delay-line ring oscillator 408 until such time as the Replica_done input is provided to the logic gate (e.g., when the bitline actually begins discharging). This, in turn, causes the Increment input to stop and the counter 412 to stop incrementing the count value. At this time, the count value in the counter 412 can be used to measure a relative delay of the memory array.

It should be noted that the delay line in the calibration circuit may be identical or very similar to the delay line in each memory. Thus, the speed measured in the calibration circuit may be a valid indication of the delay line speed in the memory, which controls the timing in the memory.

Figure 5A:
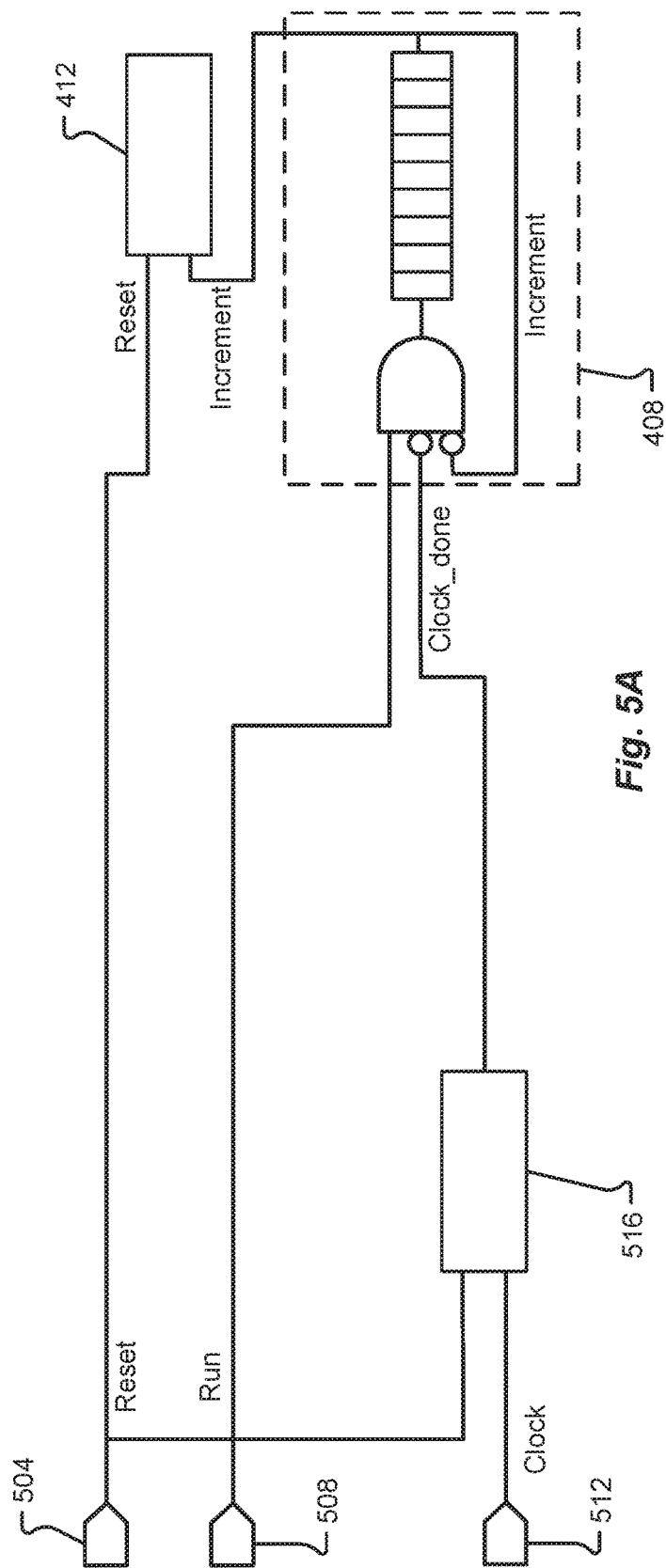
FIG. 5A is a circuit diagram depicting an illustrative circuit for measuring absolute delay using a replica bitcell array in accordance with embodiments of the present disclosure.
Figure 5B:
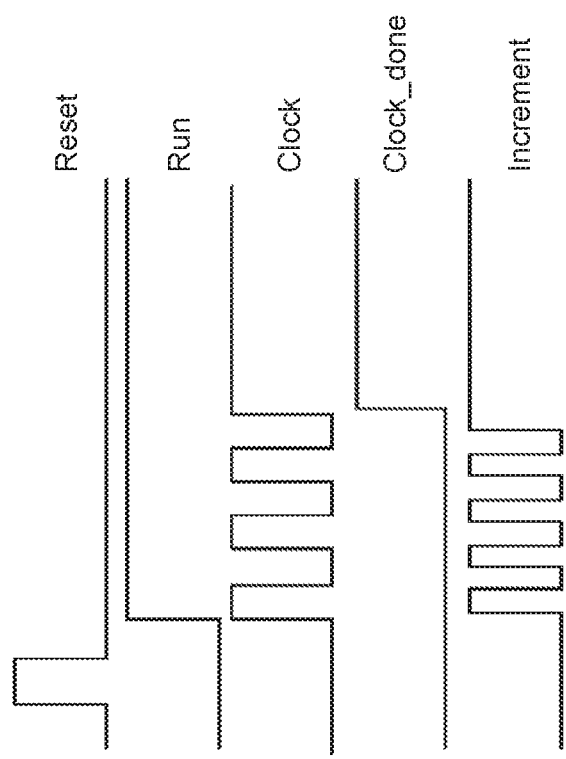
FIG. 5B is a timing diagram depicting the various signals of FIG. 5A.

With reference now to FIGS. 5A and 5B, an example of a delay calibration circuit 124 used to measure absolute delay will be described in accordance with at least some embodiments of the present disclosure. The circuit of FIG. 5A is shown to include a Reset input 504, a Run input 508, and a clock input 512. The circuit is also shown to include two counters 412, 516, and a delay-line ring oscillator 408. The first counter 412 may be similar or identical to the counter 412 of FIG. 4A and receive both a Reset input 504 and an Increment input from the delay-line ring oscillator 408. The delay-line ring oscillator 408 may also be similar or identical to the delay-line ring oscillator 408 of FIG. 4A.

The second counter 516 may receive inputs from the clock input 512 and from the Reset input 504. The second counter 516 and first counter 412 may both be reset with the Reset input 504 and then the delay-line ring oscillator 408 may be started as substantially the same time as the clock signal 512 is started. Both counters 412, 516 will update until the clock reaches a predetermined value (e.g., seven cycles as shown in FIG. 5B). Once the predetermined value of the clock signal 512 has been reached, the second counter 516 will provide the Clock_done input to the delay-line ring oscillator 408. The count value of the second counter 516 can then be compared to the count value of the first counter 412 at this point in time and will indicate the speed of delay cells with respect to an absolute clock signal 512. It should be appreciated that using multiple or a larger number of clock cycles from the clock signal 512 will reduce the effects of clock jitter on the measurement.

It should be noted that the delay line in the calibration circuit may be identical or very similar to the delay line in each memory. Thus, the speed measured in the calibration circuit may be a valid indication of the delay line speed in the memory, which controls the timing in the memory.

Figure 6A:
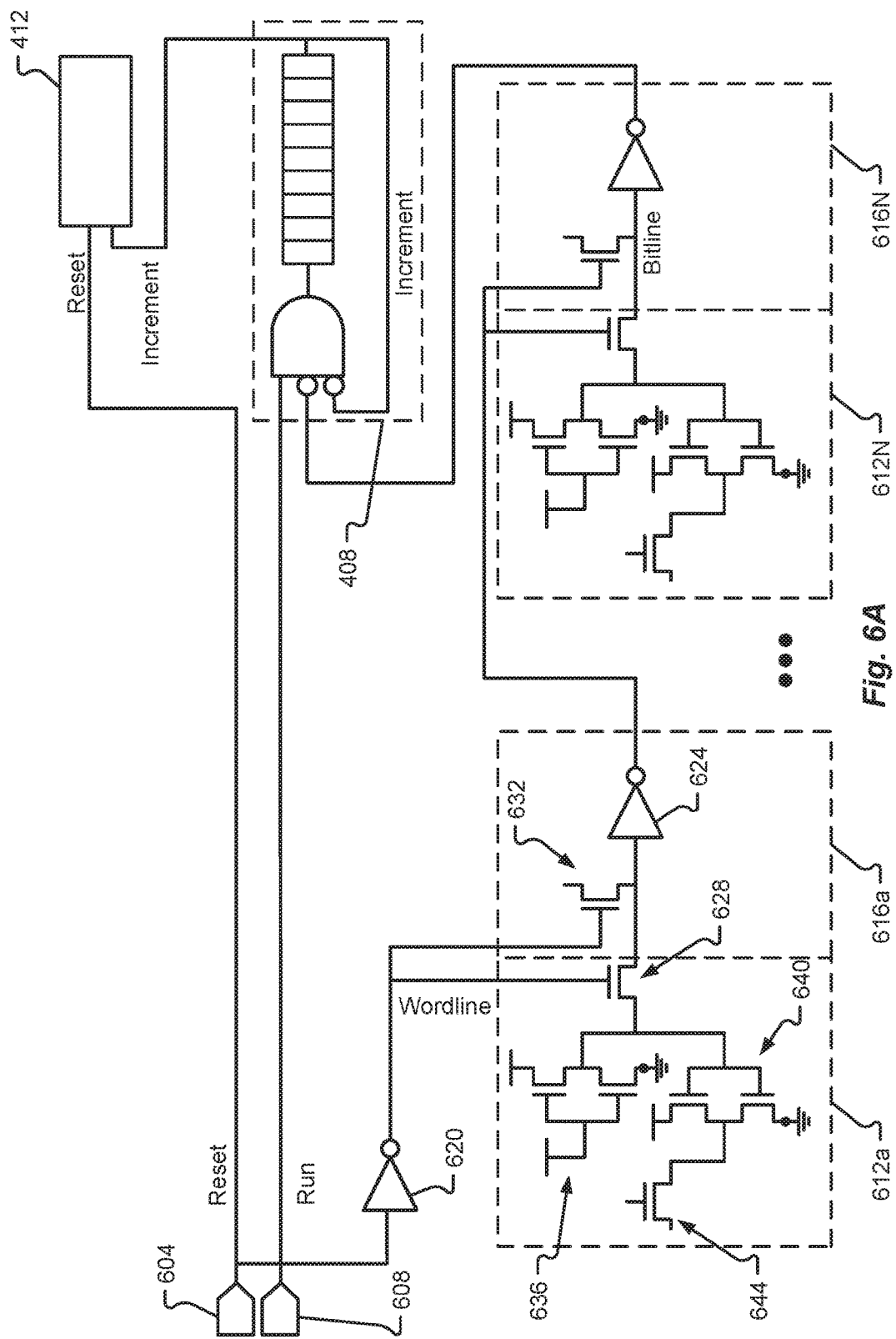
FIG. 6A is a circuit diagram depicting an illustrative circuit showing actual bitcell versus delay measurements in accordance with embodiments of the present disclosure.
Figure 6B:
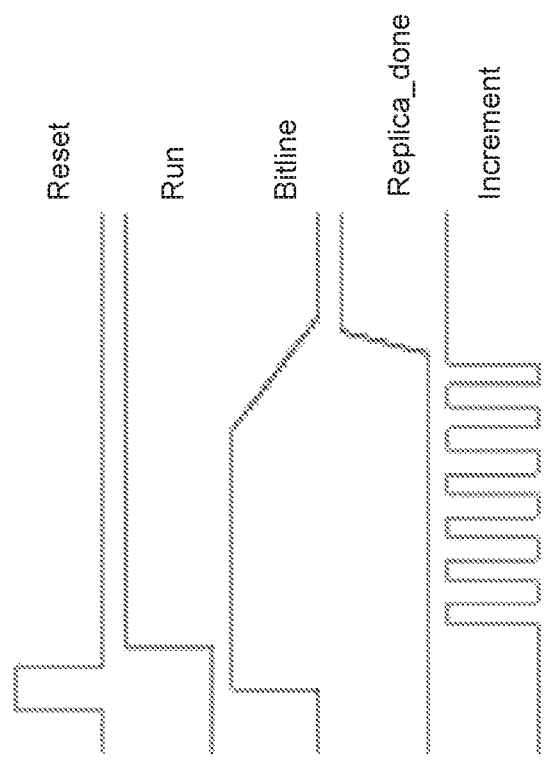
FIG. 6B is a timing diagram depicting the various signals of FIG. 6A.

With reference now to FIGS. 6A and 6B, the actual bitcell operation versus delay measurement will be described in accordance with at least some embodiments of the present disclosure. The circuit again is shown to include a Reset input 604 and a Run input 608. The Reset input 604 is provided to the first counter 412 and to the inverter 620 for discharging the wordline via a first logic switch 628 and second logic switch 632, both of which may correspond to a transistor such as a MOSFET. The wordline is provided to a plurality of tracking bitcells 612a-N and a plurality of sense amplifier models 616a-N, which are shown to include the second switch 632 and an inverter 624 as opposed to the capacitor of FIG. 4A. The tracking bitcells 612a-N are further shown to include a first pair of transistors 636 and a second pair of transistors 640 connected to one another. The second pair of transistor 640 may also be connected to a third transistor 644. The various transistors of the tracking bitcells 612*a*-N and sense amplifier models 616*a*-N may correspond to any type of transistors, such as N-type MOSFETs, P-type MOSFETs, combinations thereof, or the like. In some embodiments, each pair of transistors 636, 640 may both have an N-type MOSFET and a P-type MOSFET. Again, by having the plurality of tracking bitcells connected in parallel, the effects of local variation can be reduced. In some embodiments, the configuration of the circuit in FIG. 6A may be similar to the circuit of FIG. 4A except that multiple tracking bitcells 612*a*-N are connected together in parallel. Otherwise, operation of the circuit in FIG. 6A may be similar or identical to the circuit of FIG. 4A.

It should be noted that the delay line in the calibration circuit may be identical or very similar to the delay line in each memory. Thus, the speed measured in the calibration circuit may be a valid indication of the delay line speed in the memory, which controls the timing in the memory.

Figure 7:
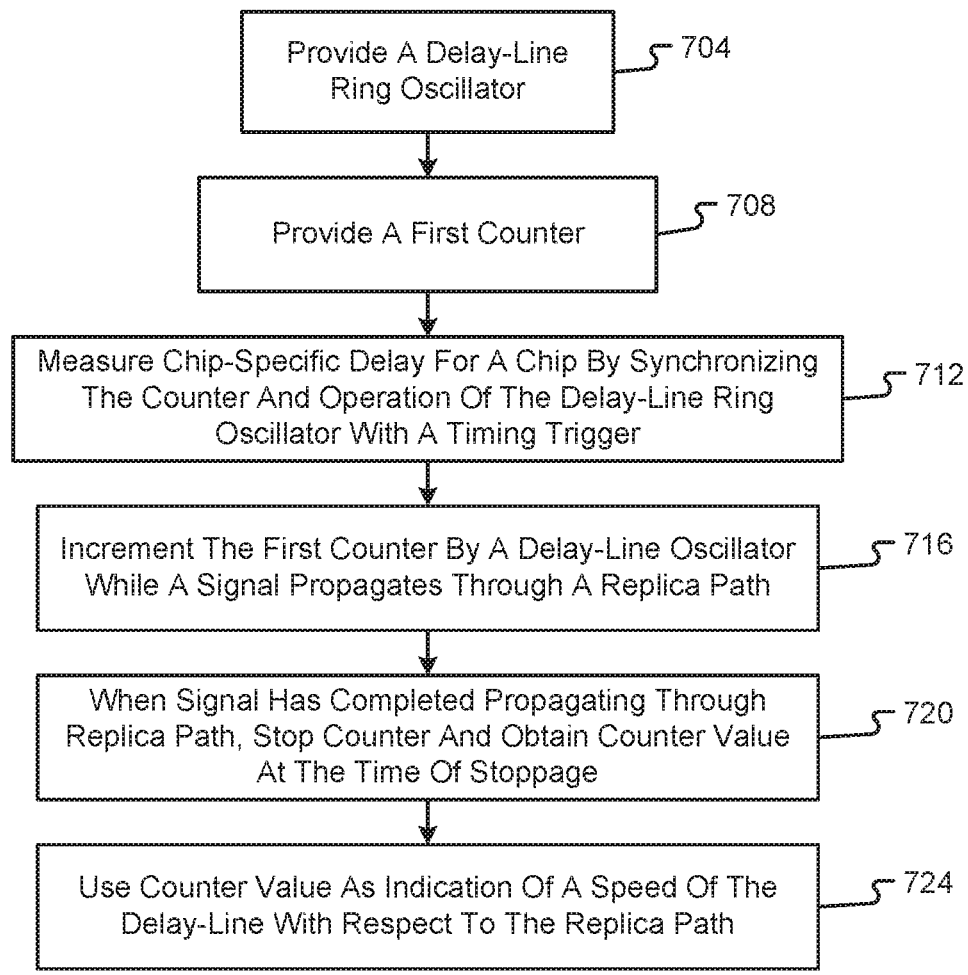
FIG. 7 is a flow diagram depicting a method of measuring relative delay in accordance with embodiments of the present disclosure.

With reference now to FIG. 7, a method of measuring or determining a relative speed or delay of a delay-line will be described in accordance with at least some embodiments of the present disclosure. The method begins by providing a delay-line ring oscillator 408 on silicon/chip (step 704) with a first counter 412 (step 708). Once provided, the method continues by measuring a chip-specific delay for the chip having the oscillator 408 and counter 412 by synchronizing the counter 412 and operation of the oscillator 408 with a timing trigger (step 712). In some embodiments, the timing trigger may correspond to both components receiving a common Reset input 416. In some embodiments, the timing trigger may correspond to a time where the replica path comprising N bitcells is triggered.

Once triggered, the first counter 412 is incremented by the delay-line ring oscillator 408 for as long as it takes for a signal to propagate through a replica path 404 (step 716). When the signal is done propagating through the replica path 404, the delay-line ring oscillator 408 stops providing increment instructions to the first counter 412 and the counter value of the first counter is obtained (step 720). The final counter value at the end of signal propagation is then used as an indication of a speed of the delay-line with respect to the replica path 404 (step 724). This delay information can then be used to update the lookup table 216 and ultimately adjust one or more fuses 312 if needed.

Figure 8:
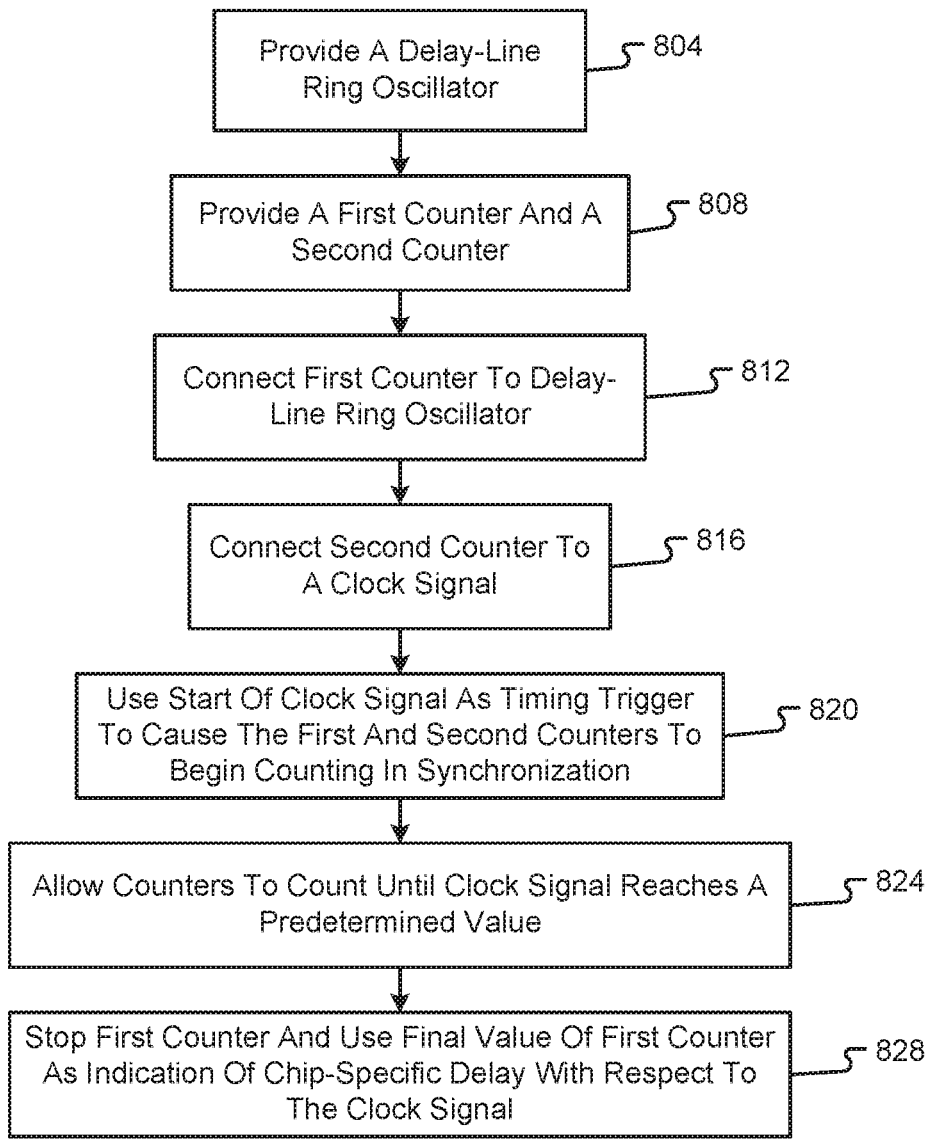
FIG. 8 is a flow diagram depicting a method of measuring absolute delay in accordance with embodiments of the present disclosure.

With reference now to FIG. 8, a method of measuring or determining absolute (e.g., relative to a clock signal) speed or delay of a delay-line will be described in accordance with at least some embodiments of the present disclosure. The method begins by providing a delay-line-ring oscillator 408 on a common piece of silicon/chip with a first counter 412 and second counter 516 (steps 804 and 808). The method continues by connecting the first counter 412 with the delay-line ring oscillator 408 (step 812). The second counter 516 is connected to a clock signal (step 816).

Thereafter, the start of a clock signal is used as a timing trigger to cause the first and second counters to begin counting in synchronization (e.g., by starting at substantially the same time) (step 820). The counters 412, 516 are allowed to count until the clock signal reaches a predetermined value or number of cycles (step 824). At this point, the first counter 412 is stopped and the final count value of the first counter 412 is used as an indication of the chip-specific delay with respect to the clock signal (step 828). This delay information can then be used to update the lookup table 216 and ultimately adjust one or more fuses 312 if needed.

It is noted that the embodiments were described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A computer memory system, comprising:
a memory array comprising a plurality of memory cells; and
a delay calibration circuit comprising a delay-line that is used to measure a chip-specific delay between when a bitline is discharged by a bitcell and when a sense amplifier is used to detect a memory value from the memory array, wherein the delay calibration circuit triggers the delay-line to begin measuring the chip-specific delay in response to a timing trigger, wherein the delay calibration circuit further comprises a first counter, a second counter, and a clock signal, wherein the first counter is connected to the delay-line, wherein the second counter is connected to the clock signal, and wherein the timing trigger corresponds to a time where the clock signal is started and the first and second counters both begin counting at substantially the same time.

2. The computer memory system of claim 1, wherein both the first counter and second counter continue counting until the clock signal reaches a predetermined value at which time the first counter is stopped and a final value of the first counter provides an indication of the chip-specific delay with respect to the clock signal.

3. The computer memory system of claim 1, wherein the delay-line comprises a delay-line ring oscillator.

4. The computer memory system of claim 1, wherein the delay calibration circuit measures a delay associated with a read operation and/or a write operation in which a chip is used to read data from and/or write data to the memory array.

5. The computer memory system of claim 1, wherein the memory array is provided on a chip.

6. The computer memory system of claim 1, wherein the plurality of memory cells comprise a plurality of different types of memory cells.

7. The computer memory system of claim 1, wherein the delay calibration circuit and the memory array are provided on a common piece of silicon.

8. The computer memory system of claim 1, wherein the chip-specific delay is stored to a lookup table.

9. A delay calibration circuit, comprising:
a delay-line that is used to measure a chip-specific delay between when a bitline is discharged by a bitcell and when a sense amplifier is used to detect a memory value from a memory array, wherein the delay-line is triggered to begin measuring the chip-specific delay in response to a timing trigger;
a first counter connected to the delay-line;
a second counter; and a clock signal, wherein the second counter is connected to the clock signal, and wherein the timing trigger corresponds to a time where the clock signal is started and the first and second counters both begin counting at substantially the same time.

10. The delay calibration circuit of claim 9, wherein both the first counter and second counter continue counting until the clock signal reaches a predetermined value at which time the first counter is stopped and a final value of the first counter provides an indication of the chip-specific delay with respect to the clock signal.

11. The delay calibration circuit of claim 9, wherein the delay-line comprises a delay-line ring oscillator.

12. The delay calibration circuit of claim 9, wherein a delay associated with a read operation and/or a write operation is measured in which a chip is used to read data from and/or write data to a memory array.

13. The delay calibration circuit of claim 12, wherein the memory array is provided on a chip.

14. The delay calibration circuit of claim 13, wherein the memory array includes a plurality of memory cells of different types.

15. The delay calibration circuit of claim 9, wherein the chip-specific delay is stored to a lookup table.

16. A system, comprising:
a memory array; and
a delay calibration circuit, comprising:
a delay-line that is used to measure a chip-specific delay between when a bitline is discharged by a bitcell and when a sense amplifier is used to detect a memory value from the memory array, wherein the delay-line is triggered to begin measuring the chip-specific delay in response to a timing trigger;
a first counter connected to the delay-line;
a second counter; and
a clock signal, wherein the second counter is connected to the clock signal, and wherein the timing trigger corresponds to a time where the clock signal is started and the first and second counters both begin counting at substantially the same time.

17. The system of claim 16, wherein both the first counter and second counter continue counting until the clock signal reaches a predetermined value at which time the first counter is stopped and a final value of the first counter provides an indication of the chip-specific delay with respect to the clock signal.

18. The system of claim 16, wherein the delay-line comprises a delay-line ring oscillator.

19. The system of claim 16, wherein a delay associated with a read operation and/or a write operation is measured in which a chip is used to read data from and/or write data to a memory array.

20. The system of claim 16, wherein the chip-specific delay is stored to a lookup table.

* * * * *